United States Patent
Andreas

(10) Patent No.: US 8,283,257 B2
(45) Date of Patent: Oct. 9, 2012

(54) SYSTEMS AND METHODS FOR OSCILLATING EXPOSURE OF A SEMICONDUCTOR WORKPIECE TO MULTIPLE CHEMISTRIES

(75) Inventor: Michael Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 615 days.

(21) Appl. No.: 11/766,632

(22) Filed: Jun. 21, 2007

(65) Prior Publication Data

US 2008/0318434 A1    Dec. 25, 2008

(51) Int. Cl.
*H01L 21/302* (2006.01)
*H01L 21/461* (2006.01)
*C03C 15/00* (2006.01)
*C03C 25/68* (2006.01)

(52) U.S. Cl. ........... 438/745; 438/749; 438/750; 216/83

(58) Field of Classification Search .................. None
See application file for complete search history.

(56) References Cited

U.S. PATENT DOCUMENTS

| | | | |
|---|---|---|---|
| 6,488,040 B1 | 12/2002 | de Larios et al. | |
| 6,616,772 B2 * | 9/2003 | de Larios et al. | 134/21 |
| 6,913,523 B2 * | 7/2005 | Sharples et al. | 451/56 |
| 7,045,018 B2 | 5/2006 | Ravkin et al. | |
| 7,583,358 B2 | 9/2009 | Benson | |
| 2003/0089891 A1 * | 5/2003 | Andreas | 252/500 |
| 2004/0031503 A1 | 2/2004 | Eitoku | |
| 2005/0217703 A1 * | 10/2005 | O'Donnell | 134/21 |
| 2006/0054181 A1 * | 3/2006 | Rayandayan et al. | 134/1 |
| 2006/0124153 A1 * | 6/2006 | Yun et al. | 134/2 |
| 2006/0260647 A1 | 11/2006 | Verhaverbeke et al. | |

FOREIGN PATENT DOCUMENTS

WO    WO-2006088713 A2    8/2006

OTHER PUBLICATIONS

International Search Report and Written Opinion for International Application No. PCT/US2008/064589, Aug. 18, 2008.
Office Action issued Dec. 30, 2011 in Taiwan Application No. 097120778, 22 pages.

* cited by examiner

*Primary Examiner* — Nadine G Norton
*Assistant Examiner* — Stephanie Duclair
(74) *Attorney, Agent, or Firm* — Perkins Coie LLP

(57) ABSTRACT

Systems and methods for oscillating exposure of a semiconductor workpiece to multiple chemistries are disclosed. A method in accordance with one embodiment includes sequentially exposing a portion of a semiconductor workpiece surface to a first chemistry having a first chemical composition and a second chemistry having a second chemical composition different than the first. Prior to rinsing the portion of the workpiece surface, the portion is sequentially exposed to the first and second chemistries again. The first and second chemistries are removed from the portion, and, after sequentially exposing the portion to each of the first and second chemistries at least twice, and removing the first and second chemistries, the portion is rinsed and dried.

40 Claims, 4 Drawing Sheets

SYSTEMS AND METHODS FOR OSCILLATING EXPOSURE OF A SEMICONDUCTOR WORKPIECE TO MULTIPLE CHEMISTRIES

TECHNICAL FIELD

The present disclosure is directed generally to systems and methods for oscillating the exposure of a semiconductor workpiece to multiple chemistries, for example, to remove particles from the workpiece, and/or to conduct other processes on the workpiece.

BACKGROUND

Many chemical processes are required to manufacture semiconductor devices. These processes include deposition processes, photolithography processes, etching processes, chemical mechanical polishing (CMP) processes and/or electrochemical mechanical polishing (ECMP) processes, among others. As a result of carrying out the foregoing processes, the semiconductor workpiece on which the processes are conducted typically becomes contaminated with particulate residue. Accordingly, the workpiece must be periodically rinsed and dried to prevent the particulate residue from interfering with subsequent process steps.

Several existing techniques have been developed for rinsing semiconductor workpieces. One such technique includes a rinse bath in which the workpiece is immersed in a volume of rinse solution and then dried. A drawback with this technique is that it requires a large volume of rinse liquid which then becomes contaminated with particulate matter and must be disposed of in accordance with proper handling procedures. The larger the volume of liquid that must be disposed of, the more time-consuming and/or expensive the disposal process becomes. Accordingly, other techniques that require smaller volumes of rinse liquid have been developed. One such technique includes a spin rinse/dry process in which the rinse liquid is disposed on the workpiece and the workpiece is then spun at high speed to both remove the rinse liquid and dry the workpiece. Another technique includes a proximity cleaning technique in which a rinse fluid is delivered to a local region of the workpiece and then removed (along with contaminating particulate matter) by suction. A representative device for carrying out such a process is disclosed in U.S. Pat. No. 7,045,018 to Ravkin, et al., assigned to Lam Research Corporation of Fremont, Calif.

While the foregoing techniques have generally proven to be effective, there is a continual need to improve the efficiency with which workpieces are cleaned, e.g., by reducing the number of particulates left by such techniques. There is also a continual need to reduce the volume of fluid required by such techniques. Furthermore, there is a need to improve the efficiency with which other semiconductor chemical processes are conducted.

DETAILED DESCRIPTION

Figure 1:
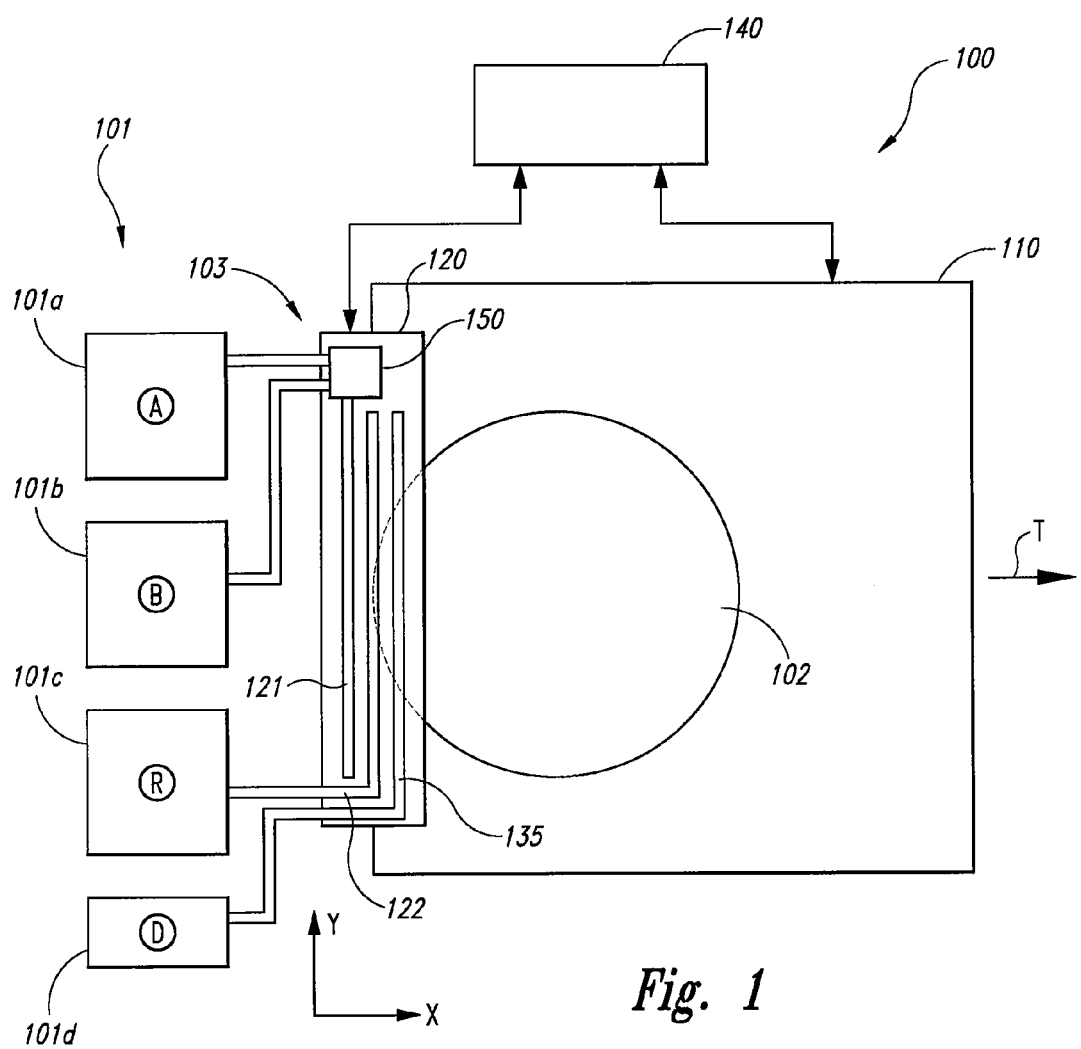
FIG. 1 is a schematic plan view of an apparatus configured to process semiconductor workpieces in accordance with several embodiments of the invention.

Specific details of several embodiments of the disclosure are described below with reference to semiconductor workpieces and systems for processing the workpieces. The workpieces can include micromechanical components, data storage elements, optics, read/write components, or other features. For example, the workpieces can include wafers having dies including SRAM, DRAM (e.g., DDR-SDRAM), flash-memory (e.g., NAND flash-memory), processor, imager, and/or other dies. Although many of the embodiments are described below with respect to semiconductor devices that have integrated circuits, other embodiments include other types of devices manufactured on other types of substrates. Several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIGS. 1-7.

A particular method for processing a semiconductor workpiece includes sequentially exposing a portion of the workpiece surface to a first chemistry having a first chemical composition and a second chemistry having a second chemical composition different than the first. Prior to rinsing the portion of the workpiece surface, it is sequentially exposed to the first and second chemistries again. The method further includes removing the first and second chemistries and rinsing and drying the portion after sequentially exposing the portion to each of the first and second chemistries at least twice, and removing the first and second chemistries. In further particular embodiments, the first and second chemistries can be selected to have different pHs so as to facilitate removing particles from the surface of the workpiece. In other embodiments, the first and second chemistries can have different surfactant characteristics. In yet further embodiments, one of the chemistries can include an oxidizing chemistry and the other can include an acidic chemistry for etching or otherwise removing material from the workpiece.

An apparatus in accordance with a particular embodiment, and suitable for carrying out the foregoing methods, can include a workpiece support and a process head, at least one of which is linearly movable relative to the other. The process head includes at least one fluid delivery port and at least one fluid removal port. A valve can be coupled in fluid communication with a first source of chemistry, a second source of chemistry, and the fluid delivery port. The controller can be operatively coupled to the valve and programmed with instructions directing the valve to change between a first state and a second state at particular intervals, for example, ten seconds or less. In the first state, the valve directs a first fluid from the first source to exit through the process head, and in the second state, the valve directs a second fluid from the second source to exit through the process head. By alternating between the first and second chemistries, the workpiece can be rapidly exposed to both chemistries, which can enhance or facilitate particulate removal from the workpiece, and/or produce other effects at the workpiece.

FIG. 1 is a schematic plan view of an apparatus 100 configured to process a semiconductor workpiece 102 (e.g., a semiconductor wafer) in accordance with several embodiments of the invention. The apparatus 100 includes a support 110 that carries the semiconductor workpiece 102, a chemical delivery/removal system 103 that delivers chemicals to the semiconductor workpiece 102 for processing (and also removes the chemicals), and a controller 140 that controls the operation of the support 110 and the chemical delivery/removal system 103. The controller 140 and the chemical delivery/removal system 103 are configured to sequentially expose the workpiece 102 to multiple chemicals in selected manners, for example, via rapid oscillations, as described in greater detail below. Accordingly, the controller 140 can include a programmable computer-readable medium carrying instructions for directing the operation of the foregoing components.

In a particular embodiment, the support 110 translates linearly, as indicated by arrow T, beneath a chemical delivery/removal head 120. The head 120 can span the diameter (or other dimension) of the workpiece 102 so that the support 110 need translate along only one axis to treat the entire workpiece 102. As the semiconductor workpiece 102 passes beneath the head 120, the head dispenses and removes multiple chemistries using a "proximity" treatment technique in which limited portions of the semiconductor workpiece 102 are treated in a sequential manner without immersing the entire workpiece 102. The head 120 can be coupled to multiple chemical sources 101, including a first source 101a that delivers a first chemistry A, a second source 101b that delivers a second chemistry B, a third source 101c that delivers a rinse fluid R, and a fourth source 101d d that delivers a drying fluid D. The first and second sources 101a, 101b can be coupled to a valve 150 that delivers the chemistries to a chemistry manifold 121 for ultimate delivery to the semiconductor workpiece 102. The rinse fluid R can be connected to a corresponding rinse manifold 122, and the drying fluid D can be coupled to a drying manifold 135. Flow through the rinse manifold 122 and the drying manifold 135 can also be controlled with valves, which are not shown in FIG. 1 for purposes of clarity. During a proximity treatment process, the semiconductor workpiece 102 passes beneath the head 120, and portions of the workpiece 102 are sequentially exposed to fluids provided by the chemistry manifold 121, the rinse manifold 122, and the drying manifold 135. The fluids provided by each of these manifolds are also removed directly from the workpiece surface, as is described below with reference to FIG. 2.

Figure 2:
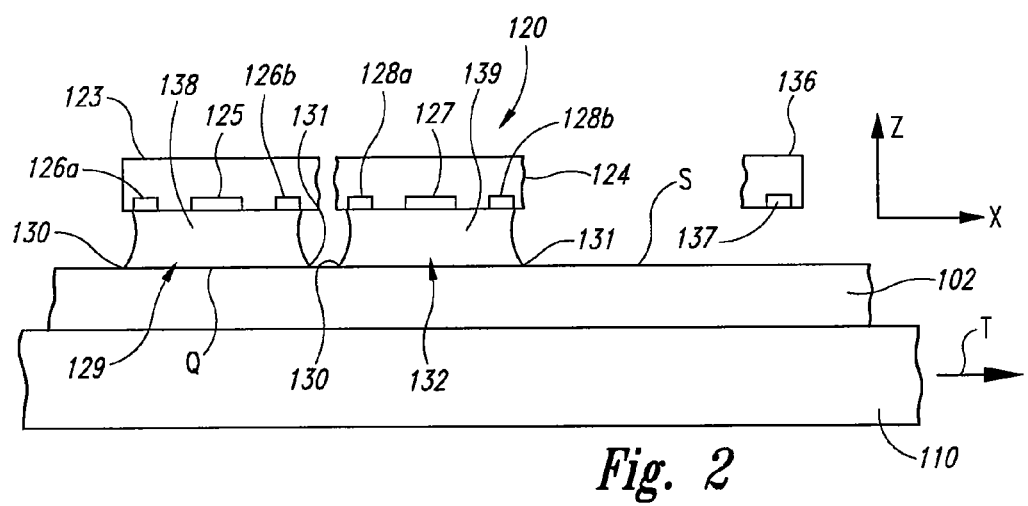
FIG. 2 is a schematic, side elevation view of a portion of the apparatus shown in FIG. 1.

FIG. 2 is a partially schematic, side elevational illustration of the head 120 and the workpiece 102, configured in accordance with a particular embodiment. The head 120 can include a chemistry element 123 that delivers and removes processing chemistry, a rinse element 124 that delivers and removes rinse fluid, and a drying element 136 that delivers (and optionally removes) a drying fluid. Each of the foregoing elements may be carried by a single head 120, or the elements may be distributed over multiple heads, depending upon the particular installation.

The chemistry element 123 can include a chemistry delivery port 125 and two chemistry vacuum ports, illustrated as a leading chemistry vacuum port 126a and a trailing chemistry vacuum port 126b. Chemistry is provided via the chemistry delivery port 125 to a chemistry zone 129 at the surface S of the workpiece 102, and is removed via the vacuum ports 126a, 126b. The chemistry zone 129 moves over the surface S of the workpiece 102 due to the relative motion between the head 120 and the support 110. A chemistry fluid volume 138 (e.g., a meniscus) formed between the vacuum ports 126a, 126b includes a leading edge 130 proximate to the leading vacuum port 126a, and a trailing edge 131 proximate to the trailing vacuum port 126b. A point Q on the surface S of the workpiece 102 first encounters the leading edge 130 as the workpiece 102 moves from left to right, and then encounters the trailing edge 131.

The rinse element 124 can be arranged in a manner generally similar to that of the chemistry element 123. Accordingly, the rinse element 124 can include a rinse delivery port 127 that delivers a rinse fluid (e.g., deionized water) to a rinse zone 132. A rinse fluid volume 139 (e.g., another meniscus) has a leading edge 130 and a trailing edge 131. A leading rinse vacuum port 128a and a trailing rinse vacuum port 128b together confine the rinse fluid volume 139 to the rinse zone 132 between these two ports. Optionally, the leading rinse vacuum port 128a can be combined with the trailing chemistry vacuum port 126b, for example, when mixing the fluid exiting the rinse zone 132 and the fluid exiting the chemistry zone 129 is not undesirable.

The drying element 136 can include a drying fluid delivery port 137 configured to provide an appropriate drying fluid, for example, a mixture of isopropyl alcohol and nitrogen. The drying fluid can be provided in gaseous form and therefore, a removal port is not required to remove the drying chemistry from the workpiece 102. A given portion of the workpiece surface S may be in the chemistry zone 129 receiving chemistry via the chemistry delivery port 125, while another portion is in the rinse zone 132 receiving rinse fluid from the rinse delivery port 127, and while a third portion is being dried, and while still other portions of the workpiece surface S are not exposed to the chemistry, the rinse liquid or the drying fluid.

Figure 3:
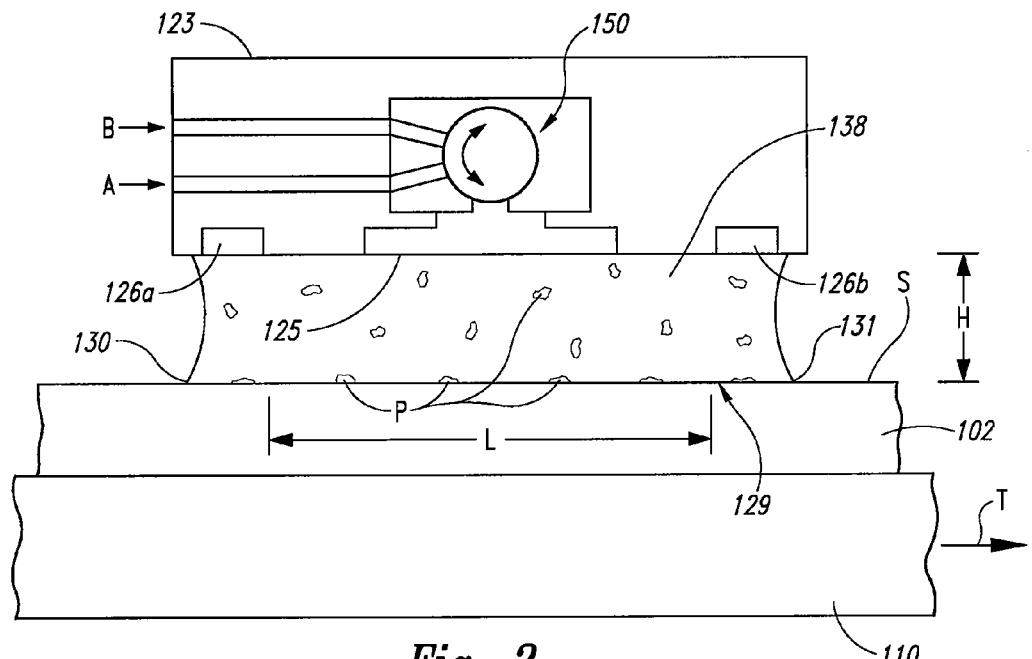
FIG. 3 is an enlarged, schematic side elevation view of a portion of the apparatus shown in FIG. 2.
Figure 4:
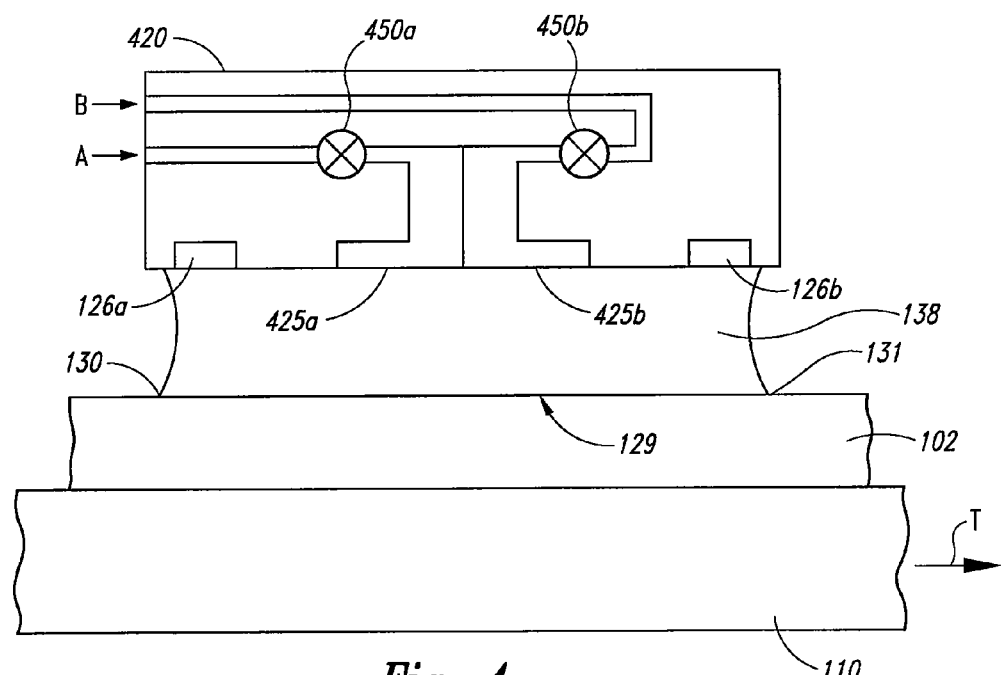
FIG. 4 is a schematic side elevation view of a process head configured in accordance with an embodiment of the invention.

FIG. 3 is an enlarged, schematic side view of an embodiment of the chemistry element 123 described above with reference to FIG. 2. The chemistry element 123 can house the valve 150. The valve 150 can include a rotary valve, as shown in FIG. 3, or another suitable valving device, and can be coupled to both the first source 101a (FIG. 1) and the second source 101b (FIG. 1) to receive chemistry A and chemistry B, respectively. The valve 150 can be configured to selectively provide either chemistry A or chemistry B to the chemistry delivery port 125. Accordingly, the valve 150 can have a first state in which it provides chemistry A, and a second state in which it provides chemistry B. In a further particular aspect of the illustrated embodiment, the valve 150 is positioned close to the delivery port 125 so that as it changes state, the effect is felt very quickly at the surface S of the workpiece 102. In a particular embodiment, the length L of the chemistry zone 129 is relatively small (e.g., about 10-15 mm), and the height H between the head 120 and the workpiece surface S is also relatively small (e.g., about 0.7 mm). The width of the chemistry zone 129 (transverse to the plane of FIG. 3) is the width of the workpiece 102, e.g., 300 mm in one embodiment. Accordingly, the chemistry fluid volume 138 formed between the chemistry vacuum ports 126a, 126b is also relatively small (e.g., about 2 ml). At the same time, the flow rate of liquid provided by the chemistry delivery port 125 can be relatively high, though not so high as to cause an excessive amount of fluid flow. For example, the fluid flow rate can be about 2 lpm. Because the chemistry fluid volume 138 is small and the flow rate is high, the fluid within the chemistry fluid volume 138 can be exchanged very quickly. In a particular arrangement, the rotary valve 150 can also oscillate at a relatively high rate so as to quickly exchange chemistry A within the chemistry fluid volume 138 with chemistry B, and vice versa.

In a particular embodiment, the pHs of the first and second chemistries A, B can be different. By rapidly changing the pH of the fluid in the chemistry fluid volume 138, the electrostatic charge on particles P at or near the surface S of the workpiece 102 can also change rapidly. The result can be a rapid change in the zeta-potential and in particular, the polarity of the electrostatic charge of either the particles P or the workpiece surface S. In a particular example, the workpiece surface S can include a silicon dioxide layer with an electrostatic charge of −60 mV. The particles P can be aluminum oxide particles with an electrostatic charge of +50 mV. Accordingly, (at least initially) an attractive electrostatic force exists between the particles P and the surface S. If the pH of the chemistry fluid volume 138 is rapidly changed from pH 7 to pH 11, the electrostatic charge on the surface S can change to −110 mV and the electrostatic charge on the particles P can change to −50 mV. When the particles P and the surface S have electrostatic charges of the same polarity, the particles P can be repelled from the surface S and are accordingly more likely to be removed, either via the vacuum ports 126a, 126b, or by the rinse fluid that follows.

In the foregoing example, the relative polarity between the particles P and the surface S changed. However, such a change is not required. In general, it is expected that the attraction between the particles P and the surface S will be disturbed by a rapid perturbation of the electrostatic environment (thereby increasing the likelihood for hydrodynamic shear), whether or not the electrostatic polarity between the particles P and the surface S reverses.

The particles P in any of the foregoing embodiments can be relatively small, e.g., on the order of a micron or less. Accordingly, the changes in pH value can have a significant effect on the forces that attract and repel the particles P. The pH values can have values other than those described above in other embodiments. For example, the pH can oscillate between a value of about 5 or less and a value of about 7 or more, and in a more particular embodiment, between a value of about 2 and a value of about 10. Representative chemistries include dilute hydrochloric acid and dilute ammonia.

The change in the electrostatic force experienced by the particles P may in some cases be experienced by only some of the particles P, or the change may not have an effect that lasts long enough for a given particle P to be removed. Accordingly, the chemical composition of the chemistry fluid volume 138 can be changed multiple times so that any point within the chemistry zone 129 is exposed to multiple changes in chemistry. For example, in a particular embodiment, any point in the chemistry zone 129 is exposed to chemistry A, then chemistry B, then chemistry A again, and then chemistry B again before passing out of the chemistry zone 129. In other embodiments, any point in the chemistry zone 129 can be exposed to more cycles.

The maximum number of cycles that can be experienced by any point within the chemistry zone 129 will be limited by the length L of the chemistry zone, the amount of fluid in the chemistry fluid volume 138 (e.g., the length L, height H, and width of the chemistry fluid volume 138), the maximum actuation rate of the valve 150, and the speed of the workpiece 102. In at least some instances, it is desirable to fix the speed of the workpiece at a value that allows the rinse and dry processes to be fully executed (e.g., about 20 mm/second or less). Accordingly, the maximum number of cycles experienced by each point within the chemistry zone 129 can be controlled by the remaining variables. While the maximum number of cycles is a function of the speed of the workpiece 102, the number of cycles actually implemented can be changed independently of the speed of the workpiece 102 by simply changing the rate at which the valve 150 oscillates between chemistry A and chemistry B. In this manner, the system can provide adequate time for rinsing and drying the workpiece 102 (by setting the workpiece speed), while also oscillating the chemistry at a frequency sufficient to facilitate removal of the particles P. This frequency can have any of a variety of suitable values, for example, in a range of less than once every ten seconds up to several times (e.g., five to ten times) per second. In a representative case, the chemistry oscillates every two seconds. In any of these embodiments, the frequency can be low enough so that the composition of the chemistry fluid volume 138 completely turns over before the next change. The frequency can be high enough that each point within the chemistry zone 129 receives multiple "shocks" resulting from rapid fluid turnover.

In other embodiments, the different chemistries can be delivered to the workpiece surface in a similar oscillating manner, using other techniques. For example, referring now to FIG. 4, a head 420 configured in accordance with another embodiment includes two chemical delivery ports illustrated as a first chemical delivery port 425a and a second chemical delivery port 425b positioned adjacent to the first chemical delivery port 425a on the axis along which the workpiece 102 moves. The first chemical delivery port 425a can be coupled to the first chemistry A and the second chemical delivery port 425b can be coupled to the second chemistry B. A first valve 450a controls the flow of the first chemistry A, and a second valve 450b controls the flow of the second chemistry B. The composition of the fluid in the chemistry fluid volume 138 can be changed by opening the first valve 450a while the second valve 450b is closed (to deliver chemistry A), then closing the first valve 450a and opening the second valve 450b (to deliver chemistry B). This pattern can be repeated at a frequency that allows the chemistry fluid volume 138 to be partially or fully replenished at each cycle, and allows each point within the chemistry zone 129 to experience multiple exposures to both the first chemistry A and the second chemistry B.

Figure 5:
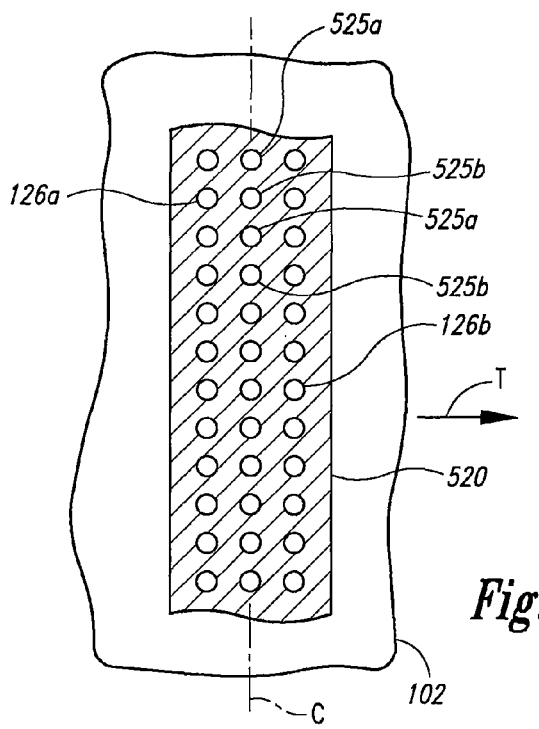
FIG. 5 is a top cross-sectional view of a portion of a process head configured in accordance with another embodiment of the invention.

FIG. 5 is a top cross-sectional view of a portion of a head 520 configured in accordance with another embodiment of the invention, and positioned above a portion of the workpiece 102. In this particular embodiment, the head 520 includes first delivery ports 525a interlineated with second delivery ports 525b along an axis C transverse to the axis T along which the workpiece 102 moves. In an aspect of this embodiment, the first ports 525a and the second ports 525b are close enough together so that chemistry delivered by either port adequately covers the chemistry zone below. In other embodiments, any of a wide variety of arrangements may be used to provide both the first and second chemistries to the surface of the workpiece 102.

Figure 6:
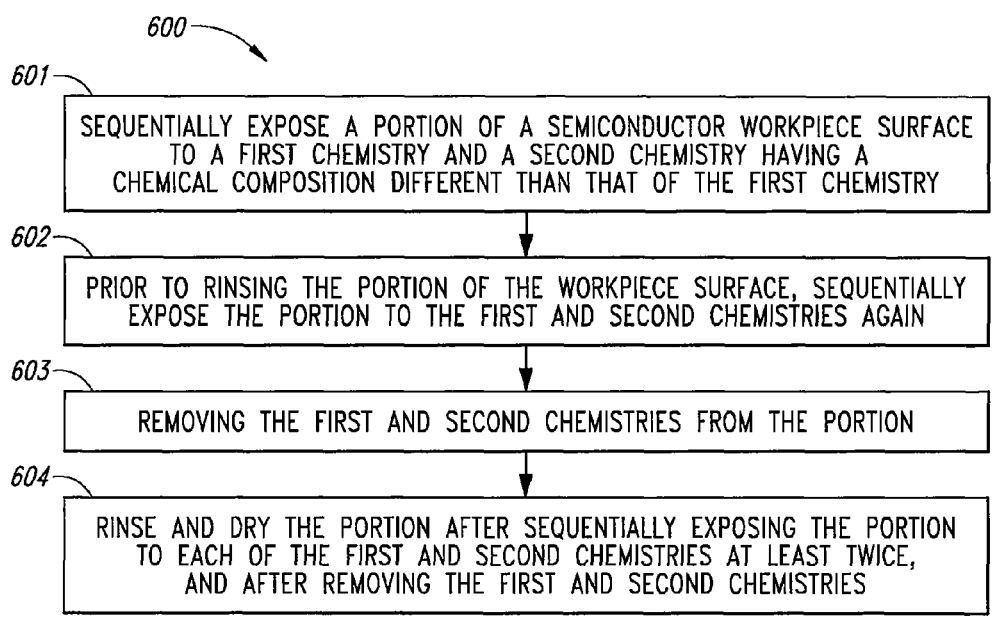
FIG. 6 is a flow diagram illustrating a process for exposing a semiconductor workpiece to multiple chemistries in accordance with several embodiments of the invention.

FIG. 6 is a flow diagram illustrating a process 600 for delivering multiple chemistries to the workpiece in accordance with an embodiment of the invention. The process 600 can include sequentially exposing a portion of a semiconductor workpiece surface to a first chemistry and a second chemistry having a chemical composition different than that of the first chemistry (process portion 601). In process portion 602, the portion of the workpiece surface is again exposed to the first and second chemistries, prior to rinsing the portion of the workpiece surface. Accordingly, the portion of the workpiece is exposed to each of the first and second chemistries twice. In process portion 603, the first and second chemistries are removed from the portion. For example, the first chemistry can be partially or completely removed from the workpiece surface before the second chemistry is dispensed on the surface, and the second chemistry can be partially or completely removed before the first chemistry portion is reintroduced to the surface. After the portion of the workpiece surface has been sequentially exposed to each of the first and second chemistries at least twice, the portion is rinsed and dried (process portion 604).

Figure 7:
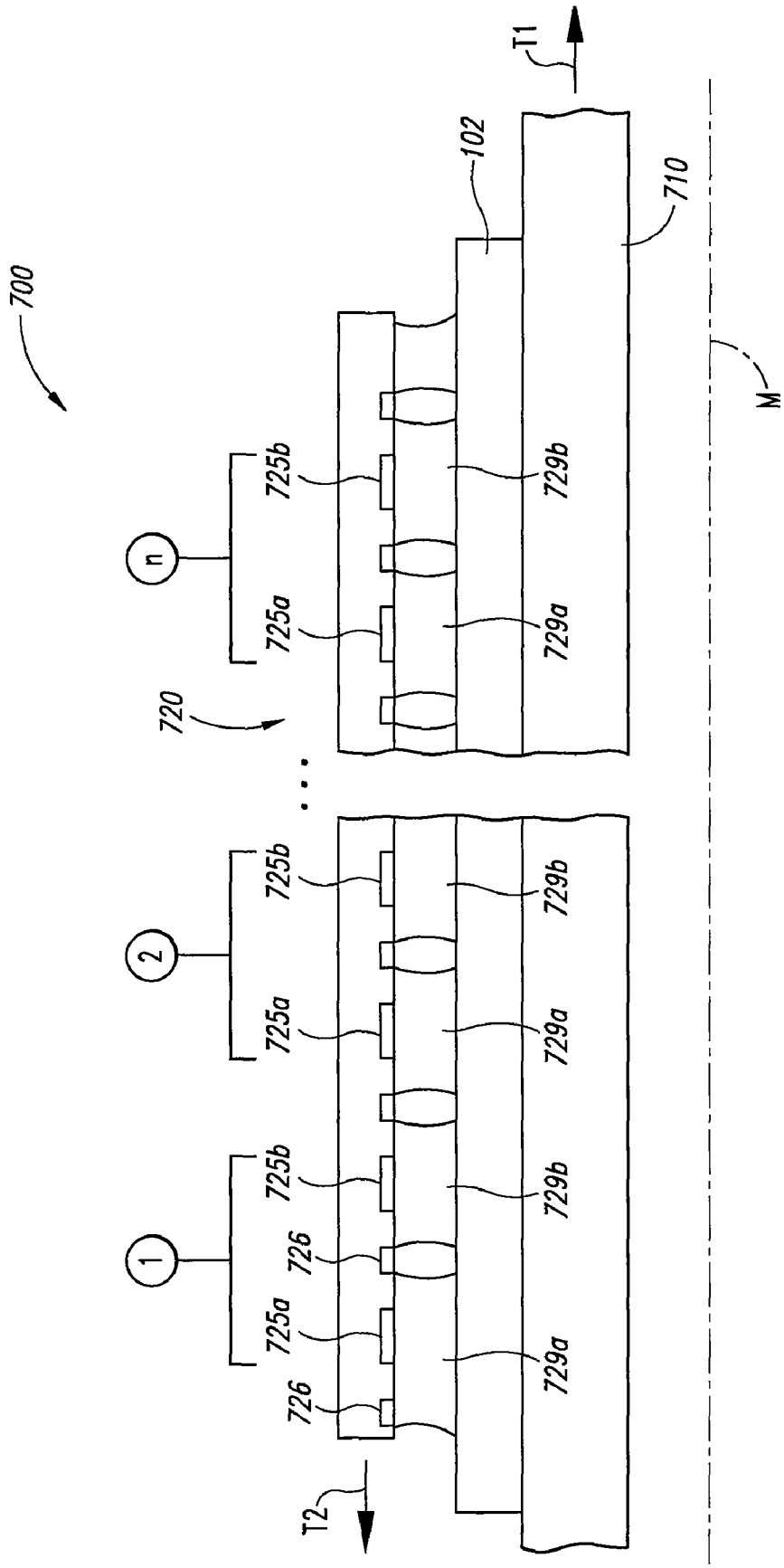
FIG. 7 is a schematic side elevation view of a process head configured in accordance with another embodiment of the invention.

FIG. 7 schematically illustrates an apparatus 700 configured in accordance with another embodiment. In this embodiment, the workpiece 102 is carried by a support 710 for movement relative to a head 720, which can include multiple pairs of delivery ports (indicated by numerals 1, 2 . . . n). Each pair includes one or more first delivery ports 725*a* (one is shown in FIG. 7), one or more second delivery ports 725*b* (one is shown in FIG. 7), separated by one or more vacuum ports 726 (one is shown in FIG. 7). Each pair can accordingly form a first chemistry zone 729*a* and a neighboring second chemistry zone 729*b*, with chemistry A provided to the first chemistry zone 729*a*, and chemistry B provided to the second chemistry zone 729*b*. During operation, the first delivery ports 725*a* can continuously provide chemistry A, the second delivery ports 725*b* can continuously provide chemistry B, and the vacuum ports 726 can continuously remove the chemistries and other material from the workpiece 102. As the head 720 and/or the support 710 move linearly along a motion axis M (indicated by arrows T2 and T1, respectively), the workpiece 102 is sequentially exposed to chemistry A, then chemistry B, then chemistry A, then chemistry B. The number of exposures can be controlled by the number of active pairs of delivery ports. The frequency with which a given point on the workpiece 102 sees a change in the chemistry can be controlled by the relative speed between the head 720 and the support 710. This arrangement can be used in lieu of the valving arrangements described above to achieve a rapid perturbation of the electrostatic environment to which the workpiece 102 is exposed.

The apparatus 700 can have other arrangements in other embodiments. For example, the apparatus 700 can include rinse and dry components that are generally similar to those shown in FIG. 2, but not shown in FIG. 7 for purposes of clarity. The apparatus 700 can include a single vacuum port 726 between the first and second chemistry zones 729*a*, 729*b*, as shown in FIG. 7, or multiple vacuum ports as shown in FIG. 2. Each chemistry zone 729*a*, 729*b* can be fed by a single corresponding port 725*a*, 725*b* as shown in FIG. 7, or by groups of multiple ports for each zone. A controller can control the frequency of chemistry oscillation by controlling the relative speed between the head 720 and the support 710, and/or the controller can control the total number of oscillations by controlling the number of active pairs of delivery ports, e.g., via a suitable control valve arrangement. In some cases, the arrangement of multiple pairs of ports shown in FIG. 7 may be used for highly energetic reactions, e.g., when the workpiece 102 is exposed to acids and/or bases that remove workpiece material from the workpiece 102 in an etching process. In some cases, the valving arrangement described previously (e.g., with reference to FIG. 2) may be used to remove particulates from the workpiece 102. In still further cases, the forgoing roles of the illustrated devices can be interchanged.

In a particular aspect of several of the embodiments described above, the first and second chemistries have different pHs so as to change the electrostatic potential (and, in a particular embodiment, the relative polarities) of the workpiece surface and/or particles that are targeted for removal from the workpiece surface. In other embodiments, the chemistries can have other characteristics. For example, the chemistries can have different surfactant characteristics which may also provide a "shock" (e.g., a surface tension shock) to the particles and may facilitate the removal of the particles from the workpiece surface. In still further embodiments, different chemistries can be used in a manner generally similar to that described above, but to produce results other than particulate removal. For example, the first chemistry can include an oxidizing chemistry and the second chemistry can include an acidic chemistry or an alkaline chemistry. By sequentially exposing the surface of the workpiece to an oxidant and an acid (or a base), the surface of the workpiece can be etched. As was described above with reference to the pH and surfactant embodiments, shocking the surface with sudden changes in chemistry (e.g., from an oxidant to an acid or base and back) can facilitate the rate at which material is etched from the workpiece. Furthermore, limiting the volume of chemistry to which the surface is exposed can allow for precise control of the etching process, and reduced consumption of the chemicals required to etch the surface.

One feature of at least some of the foregoing embodiments is that the chemistry to which a workpiece is exposed can be changed quickly and repeatedly using a proximity process. Unlike other processes (e.g., batch processes or spin processes), this arrangement can consume very small amounts of process fluid. This arrangement can also subject the workpiece to a series of chemical "shocks" e.g., rapid changes in chemistry. As a result, this arrangement can reduce attractive forces between the workpiece and residue/particles (for example, when the pH and/or surfactant characteristics of the chemistry are rapidly changed), which in turn facilitates cleaning the workpiece. In settings other than cleaning settings (for instance, during an etch process), the chemical shock can also facilitate processes for removing constituents of the workpiece, in addition to or in lieu of removing particles carried by the workpiece.

Another feature of at least some of the foregoing embodiments is that they can include oscillating a chemistry to which the workpiece is exposed, without affecting other associated processes. For example, the chemistry can be cycled at a rapid rate without changing the rate at which the workpiece is rinsed and dried. This aspect can enhance the versatility and applicability of the process.

From the foregoing, it will be appreciated that specific embodiments of the invention have been described herein for purposes of illustration, but that various modifications may be made without deviating from the invention. For example, in the illustrated embodiments, two process chemistries (aside from the rinse chemistry and the drying chemistry) are provided to the workpiece. In other embodiments, more than two chemistries may be provided, and the valve may be arranged to cycle among the multiple chemistries in any of a wide variety of manners. As described above, each point on the surface of the workpiece can be exposed to the multiple chemistries twice before undergoing a rinse process, and in other embodiments, can be exposed to the multiple chemistries more than twice, and up to any suitable value that produces the desired effect and allows other processes (e.g., the rinsing and drying processes) to be performed. In still further embodiments, the head can include slots or other apertures rather than the circular holes shown in FIG. 5. In yet further embodiments, the workpiece can undergo motion other than the linear motion described with reference to FIG. 1 and in still a further embodiment, the workpiece can remain stationary. In such a case, the process head can be moved relative to the workpiece, or the process head can include a two-dimensional array of chemistry delivery and removal ports that covers the targeted surface of the workpiece and eliminates the need to move the workpiece at all. The valve can include devices other than those shown in the Figures (e.g., a slide valve), and/or can be positioned at locations other than the process head (e.g., nearer to the chemistry sources).

Certain aspects of the invention described in the context of particular embodiments may be combined or eliminated in other embodiments. For example, the rinse and dry elements shown in FIG. 2 may be included in any of the embodiments described with reference to FIGS. 3-5. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A method for processing a semiconductor workpiece, comprising:
    positioning a process head proximate to a semiconductor workpiece with a region between the process head and the workpiece, the region being fixed relative to the process head;
    while the process head is proximate to the semiconductor workpiece, changing the chemistry of the region by exposing a portion of the semiconductor workpiece surface to a first chemistry having a first chemical composition, removing the first chemistry, exposing the portion to a second chemistry having a second chemical composition different than the first chemical composition, and removing the second chemistry;
    prior to rinsing the portion of the workpiece surface, sequentially exposing the portion to the first and second chemistries again without rinsing the portion of the workpiece surface between the operations of exposing the portion to the first chemistry and exposing the portion to the second chemistry again; and
    rinsing and drying the portion after sequentially exposing the portion to each of the first and second chemistries at least twice, and removing the first and second chemistries.

2. The method of claim 1, further comprising controlling a frequency with which the portion of the semiconductor workpiece surface is exposed to the first and second chemistries independently of a rate at which the portion is rinsed and dried.

3. The method of claim 1 wherein exposing a portion of the semiconductor workpiece surface to a first chemistry and a second chemistry includes exposing the portion to a first chemistry having a first pH and a second chemistry having a second pH different than the first pH.

4. The method of claim 3 wherein one of the first and second chemistries has a pH of about 5 or less, and the other of the first and second chemistries has a pH of about 7 or more.

5. The method of claim 1 wherein exposing a portion of the semiconductor workpiece surface to a first chemistry and exposing the portion to a second chemistry includes changing an attractive force between the surface of the semiconductor workpiece and a particle proximate to the surface of the semiconductor workpiece.

6. The method of claim 5, further comprising changing an electrostatic charge carried by at least one of the semiconductor workpiece and the particle by sequentially exposing the portion to the first and second chemistries.

7. The method of claim 5 wherein changing an attractive force includes changing an attractive force between an aluminum oxide particle and a silicon dioxide semiconductor workpiece.

8. The method of claim 5, further comprising removing the particle from the surface of the workpiece.

9. The method of claim 8 wherein removing the particle includes removing the particle while removing at least one of the first and second chemistries.

10. The method of claim 1, further comprising sequentially exposing the portion to the first and second chemistries more than twice prior to rinsing and drying the portion.

11. The method of claim 1, further comprising changing from one of the first and second chemistries to the other at a rate of at least once every two seconds.

12. The method of claim 1 wherein exposing a portion of the semiconductor workpiece surface to a first chemistry and exposing the portion to a second chemistry includes exposing the portion to a first chemistry having a first surfactant characteristic and exposing the portion to a second chemistry having a second surfactant characteristic different than the first surfactant characteristic.

13. The method of claim 1 wherein exposing a portion of the semiconductor workpiece surface to a first chemistry and exposing the portion to a second chemistry includes exposing the portion to an oxidizing chemistry and an acidic chemistry.

14. The method of claim 13, further comprising etching material from the surface of the semiconductor workpiece via successive applications of the first and second chemistries.

15. The method of claim 1 wherein exposing a portion of the semiconductor workpiece surface to a first chemistry and exposing the portion to a second chemistry includes exposing the portion to an oxidizing chemistry and an alkaline chemistry.

16. The method of claim 1, further comprising moving at least one of the semiconductor workpiece and the process head relative to the other, and directing and removing the chemistries via the process head.

17. The method of claim 16 wherein moving at least one of the semiconductor workpiece and the head relative to the other includes moving at least one of the semiconductor workpiece and the head relative to the other while directing and removing the chemistries via the head.

18. The method of claim 16 wherein moving at least one of the semiconductor workpiece and the head relative to the other includes moving at least one of the semiconductor workpiece and the head relative to the other in an at least generally continuous manner until at least approximately all portions of the semiconductor workpiece surface have been exposed to the first and second chemistries.

19. The method of claim 16 wherein directing the chemistries includes:
    directing the first chemistry to the workpiece though a first port carried by the head while directing no chemistry through a second port carried by the head; and
    directing the second chemistry to the workpiece though the second port while directing no chemistry through the first port.

20. The method of claim 16 wherein directing the chemistries includes sequentially directing the first and second chemistries to the workpiece through a common delivery port.

21. The method of claim 1, further comprising changing from exposing the portion to the first chemistry to exposing the portion to the second chemistry by activating a rotary manifold.

22. The method of claim 21 wherein activating a rotary manifold includes activating a rotary manifold carried by the head.

23. The method of claim 1 wherein exposing a portion of the semiconductor workpiece surface to a first chemistry includes exposing the portion to a first liquid, and wherein exposing the portion of a semiconductor workpiece surface to a second chemistry includes exposing the portion to a second liquid.

24. The method of claim 1 wherein exposing a portion of the semiconductor workpiece surface to a first chemistry and exposing the portion to a second chemistry includes exposing the portion to the first and second chemistries while another portion of the semiconductor workpiece surface is unexposed to either the first or the second chemistry.

25. The method of claim 1 wherein exposing a portion of the semiconductor workpiece includes exposing a portion of a semiconductor wafer.

26. The method of claim 1, wherein removing the first chemistry and removing the second chemistry comprises removing the first and second chemistries from the portion via a vacuum port.

27. A method for processing a semiconductor workpiece, comprising:
positioning a process head proximate to a semiconductor workpiece with a region between the process head and the workpiece, the region being fixed relative to the process head;
while the process head is proximate to the semiconductor workpiece, changing the chemistry of the region and reducing attractive forces between the semiconductor workpiece surface and an adjacent particle via repeated exposure of the surface to each of a first chemistry and a second chemistry having a chemical composition different than that of the first chemistry;
after repeatedly exposing the surface to each of the first and second chemistries and prior to rinsing the surface, removing the first and second chemistries and the particle from the surface; and
rinsing the surface after repeatedly exposing the surface to each of the first and second chemistries and removing the first and second chemistries and the particle from the surface.

28. The method of claim 27, further comprising drying the surface after repeatedly exposing the surface to each of the first and second chemistries.

29. The method of claim 27 wherein reducing attractive forces includes repeatedly exposing the surface to a first chemistry having a first pH and a second chemistry having a second pH different than the first.

30. The method of claim 29 wherein repeatedly exposing the surface includes repeatedly exposing the surface to a first chemistry that includes dilute hydrochloric acid and a second chemistry that includes dilute ammonia.

31. The method of claim 27 wherein repeatedly exposing the surface includes repeatedly exposing the surface of a semiconductor wafer.

32. The method of claim 27 wherein repeatedly exposing the surface includes:
repeatedly exposing a first portion of the surface to the first and second chemistries while a second portion of the surface is exposed to neither the first chemistry nor the second chemistry; and
repeatedly exposing the second portion of the surface to the first and second chemistries while the first portion of the surface is exposed to neither the first chemistry nor the second chemistry.

33. The method of claim 27, wherein removing the first and second chemistries and the particle from the surface comprises removing the first and second chemistries and the particle from the surface via a vacuum port.

34. A method for processing a semiconductor workpiece, comprising:
carrying a semiconductor workpiece;
positioning a process head proximate to the semiconductor workpiece with a region between the process head and the workpiece, the region being fixed relative to the process head;
while the process head is proximate to the semiconductor workpiece, sequentially changing a liquid chemistry of the region to sequentially expose the semiconductor workpiece surface at intervals of ten seconds or less, without spinning the workpiece;
prior to rinsing the surface of the workpiece, removing the liquid chemistry from the workpiece surface; and
rinsing and drying the workpiece surface.

35. The method of claim 34, further comprising delivering the liquid chemistry to the semiconductor workpiece through at least one delivery port, and moving at least one of the semiconductor workpiece and the at least one delivery port relative to the other along a linear path.

36. The method of claim 34 wherein sequentially changing a liquid chemistry includes alternating between exposing the surface to a first chemistry having a first chemical composition and exposing the surface to a second chemistry having a second chemical composition different than the first chemical composition.

37. The method of claim 34 wherein sequentially changing a liquid chemistry includes sequentially exposing a portion of the surface to each of a first chemistry and a second chemistry twice, before rinsing the portion, the first and second chemistries having different chemical compositions.

38. The method of claim 34 wherein sequentially changing a liquid chemistry includes sequentially changing the liquid chemistry over individual portions of the surface until at least approximately the entire surface of the workpiece has been sequentially exposed to each of the first and second chemistries at least twice.

39. The method of claim 34 wherein sequentially changing a liquid chemistry includes sequentially exposing the surface to chemistries having different pHs, and wherein the method further comprises removing particles from the surface after attractive forces between the particles and the surface have been weakened via exposure to the chemistries.

40. The method of claim 34, wherein:
sequentially changing a liquid chemistry includes sequentially exposing a portion of the surface to each of a first chemistry and a second chemistry;
rinsing the surface of the workpiece includes rinsing the surface of the workpiece with a rinse fluid; and
the first and second chemistries and the rinse fluid have different chemical compositions from one another.

* * * * *

UNITED STATES PATENT AND TRADEMARK OFFICE
CERTIFICATE OF CORRECTION

| | | |
|---|---|---|
| PATENT NO. | : 8,283,257 B2 | Page 1 of 1 |
| APPLICATION NO. | : 11/766632 | |
| DATED | : October 9, 2012 | |
| INVENTOR(S) | : Michael Andreas | |

It is certified that error appears in the above-identified patent and that said Letters Patent is hereby corrected as shown below:

In column 9, line 53, in Claim 4, delete "7or" and insert -- 7 or --, therefor.

In column 10, line 49, in Claim 19, delete "though" and insert -- through --, therefor.

In column 10, line 52, in Claim 19, delete "though" and insert -- through --, therefor.

Signed and Sealed this
Eighteenth Day of December, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,283,257 B2 | Page 1 of 1 |
| APPLICATION NO. | : 11/766632 | |
| DATED | : October 9, 2012 | |
| INVENTOR(S) | : Andreas | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 738 days.

Signed and Sealed this
Twenty-third Day of September, 2014

Michelle K. Lee
*Deputy Director of the United States Patent and Trademark Office*